US008681315B2

(12) United States Patent
Mao et al.

(10) Patent No.: US 8,681,315 B2
(45) Date of Patent: Mar. 25, 2014

(54) TUNABLE TWO-MIRROR INTERFERENCE LITHOGRAPHY SYSTEM

(75) Inventors: Weidong Mao, Hoboken, NJ (US); Ishan Wathuthanthri, Kew Gardens, NY (US); Chang-Hwan Choi, Edgewater, NJ (US)

(73) Assignee: The Trustees of the Stevens Institute of Technology, Hoboken, NJ (US)

( * ) Notice: Subject to any disclaimer, the term of this patent is extended or adjusted under 35 U.S.C. 154(b) by 0 days.

(21) Appl. No.: 13/547,824

(22) Filed: Jul. 12, 2012

(65) Prior Publication Data

US 2013/0017498 A1 Jan. 17, 2013

Related U.S. Application Data

(60) Provisional application No. 61/507,375, filed on Jul. 13, 2011.

(51) Int. Cl.
*G02B 7/198* (2006.01)

(52) U.S. Cl.
USPC .................................. 355/72; 355/53; 355/67

(58) Field of Classification Search
USPC ............................................... 355/72, 67, 53
See application file for complete search history.

(56) References Cited

U.S. PATENT DOCUMENTS 6,882,477 B1    4/2005  Schattenburg et al.
2002/0149751 A1* 10/2002  Bloomstein et al. .......... 353/122

OTHER PUBLICATIONS

Design of High-Efficiency Dielectric Reflection Gratings, B.W. Shore, M.D. Perry, J.A. Britten, R.D. Boyd, M.D. Feit, H.T. Nguyen, R. Chow and G.E. Loomis, May 1997.
In situ end-point Detection During Development of Submicrometer Grating Structures in Photoresist, Optical Engineering, Feb. 1995, vol. 34 No. 2.
High Efficiency Metallic Diffraction Gratings for Laser Applications, R.D. Boyd, J.A. Britten, D.E. Decker, B.W. Shore, B.C. Stuart, M.D. Perry, and Lifeng Li, Applied Optics, Apr. 1, 1995, vol. 34, No. 10.
Use of Interference Lithography to Pattern Arrays of Submicron Resist Structures for Field Emission Flat Panel Displays, A. Fernandez, H.T. Nguyen, J.A. Britten, R.D. Boyd, M.D. Perry, D.R. Kania, and A.M. Hawryluk, American Vacuum Society, May/Jun. 1997.
Tunable Two-Mirror Interference Lithography System, Dr. Weidong Mao, Ishan Wathuthanthri, Prof. Chang-Hwan Choi, Stevens Institute of Technology, Jun. 21, 2012.

* cited by examiner

*Primary Examiner* — Cynthia Kelly
*Assistant Examiner* — Caleen Sullivan
(74) *Attorney, Agent, or Firm* — Greenberg Traurig, LLP

(57) ABSTRACT

A two-beam interference lithography system offers large-area nanopatterning with tunability of pattern periodicities. The tunable feature is achieved by placing two rotatable mirrors in the two expanded beam paths which can conveniently be regulated for the designed pattern periodicities. While the effective interference pattern coverage is mainly determined by the optical coherence length and mirror size, the minimum pattern coverage area is as large as the effective coherence length of the laser and the selected mirror size over a wide range of periodicities.

1 Claim, 4 Drawing Sheets

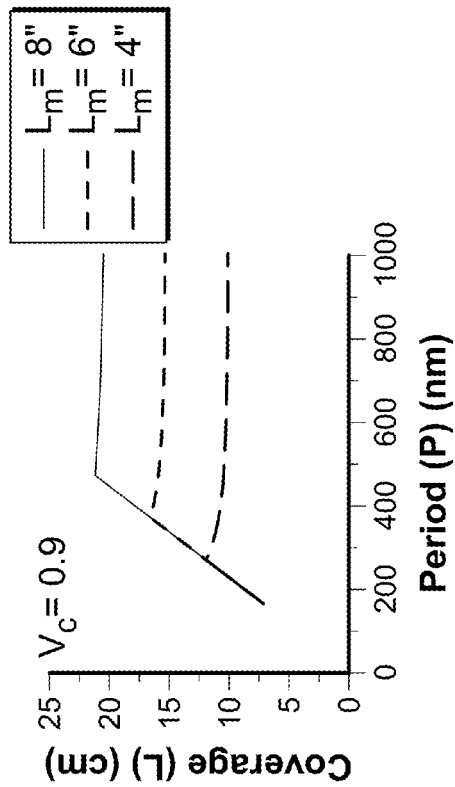
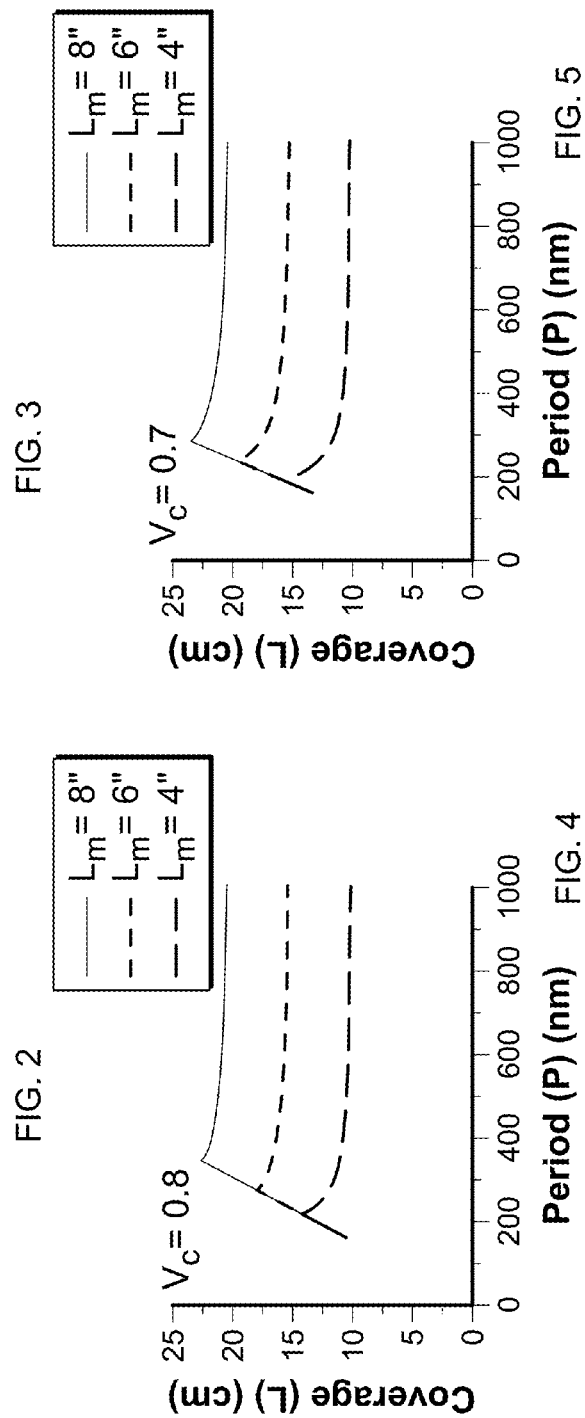
FIG. 2
FIG. 3
FIG. 4
FIG. 5

TUNABLE TWO-MIRROR INTERFERENCE LITHOGRAPHY SYSTEM

CROSS-REFERENCE TO RELATED APPLICATIONS

The present application claims the benefit of U.S. Provisional Patent Application No. 61/507,375, filed on Jul. 13, 2011, the disclosure of which is incorporated by reference herein in its entirety.

STATEMENT REGARDING FEDERALLY SPONSORED RESEARCH

Not applicable.

FIELD OF THE INVENTION

The present invention relates to an optical lithography system, and more particularly, to a tunable two-mirror interference lithography system.

BACKGROUND OF THE INVENTION

Laser interference lithography has been widely used as an effective and inexpensive technique for the fabrication of uniform nanopatterns and photonic materials on substrates. There are various geometrical configurations of interference lithography (IL) systems, the two major system configurations being the Lloyd's mirror interferometer and the conventional two-beam interferometer, such as a Mach-Zehnder interferometer. A Lloyd's mirror interferometer includes a mirror oriented perpendicular to a substrate stage, where a simple angular rotation of the entire device results in a nanoscale patterning (also referred to as "nanopatterning") with controlled pattern periodicity. However, the effective pattern coverage area is dependent on the mirror size and the optical coherence length in such a way that the coverage area is usually much less than the size of either. In contrast, a conventional two-beam interference lithography system provides two separate beams which are individually expanded and then recombined directly over the substrate to form interference patterns. Such a system may provide a greater pattern coverage area with less dependency on the optical coherence length. However, the fixed optical path of the conventional two-beam IL system makes it difficult to tune the pattern periodicity, in that it requires the laborious realignment of the entire optical path to vary the pattern period. Additionally, it is necessary to provide a large optical table and a costly high-power laser to provide enough exposure power over the long distance travelled by the expanded beams.

SUMMARY OF THE INVENTION

In an embodiment of the present invention, a two-beam interference lithography system offers large-area nanopatterning with tunability of pattern periodicities. The tunable feature is achieved by placing two rotatable mirrors in the two expanded beam paths which can conveniently be regulated for the designed pattern periodicities. While the effective interference pattern coverage is mainly determined by the optical coherence length and mirror size, the minimum pattern coverage area of the invention is as large as the effective coherence length of the laser and the selected mirror size over a wide range of periodicities. Only three components must be adjusted to select the periodicity of the pattern and the area covered by the pattern: the rotatable mirrors must be set to the desired angles and the substrate support must be translated along a line to the desired distance from the rotatable mirrors.

BRIEF DESCRIPTION OF THE DRAWINGS

For a more complete understanding of the present invention, reference is made to the following detailed description of exemplary embodiments considered in conjunction with the accompanying drawings, in which:

FIG. 2 is a graph depicting the characteristics of pattern periodicity and coverage area for a particular application of the interference lithography system of FIG. 1;

FIG. 3 is a graph depicting the influences of the critical contrast values of photoresist materials and rotatable mirror sizes on pattern periodicity and coverage area for a first case;

FIG. 4 is a graph depicting the influences of the critical contrast values of photoresist materials and rotatable mirror sizes on pattern periodicity and coverage area for a second case;

FIG. 5 is a graph depicting the influences of the critical contrast values of photoresist materials and rotatable mirror sizes on pattern periodicity and coverage area for a third case;

DETAILED DESCRIPTION OF THE INVENTION

Figure 1:
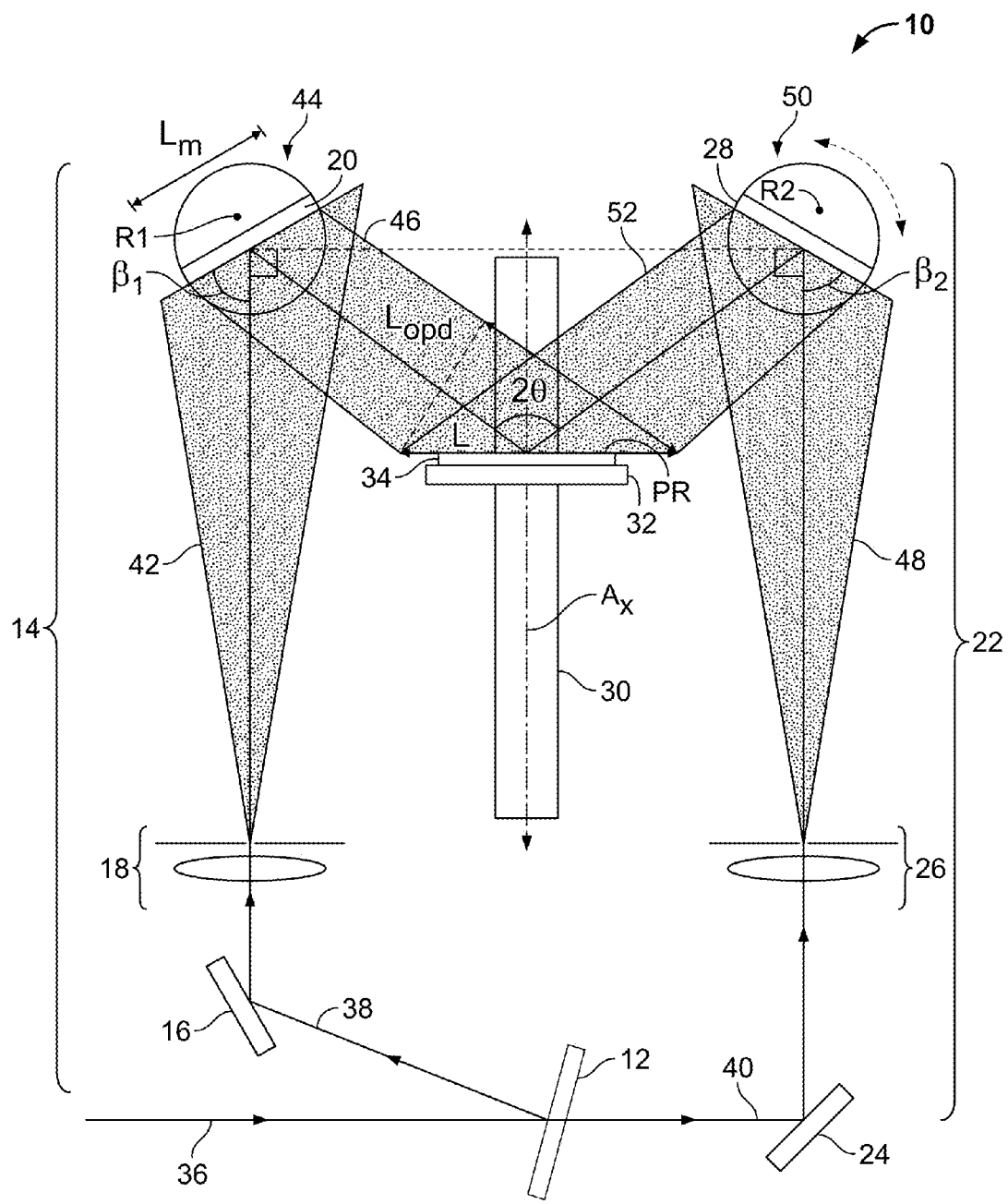
FIG. 1 is a schematic top view of a tunable two-mirror interference lithography system according to an embodiment of the present invention.

Interferometers made and operated according to embodiments of the present invention provide the periodic tunability characteristic of the Lloyd's mirror interferometer system and the superior pattern coverage characteristic of the conventional two-beam interferometer. Referring to FIG. 1, a tunable two-mirror interference lithography system 10 according to an embodiment of the present invention comprises a beam-splitter 12, a first optical path 14 which includes a first small mirror 16, a first spatial filter 18, and a first large mirror 20 on a first rotatable stage (not shown) having an axis of rotation $R_1$ that is substantially perpendicular to the plane of FIG. 1, a second optical path 22 which includes a second small mirror 24, a second spatial filter 26, and a second large mirror 28 on a second rotatable stage (not shown) having an axis of rotation $R_2$ that is substantially perpendicular to the plane of FIG. 1. The lithography system 10 also includes an elongated track 30 having an axis $A_x$ (also referred to herein as the "x-axis"), positioned such that the large mirrors 20, 28 are on opposite sides of the x-axis $A_x$. In some embodiments of the present invention, the x-axis $A_x$ is substantially equidistant from the large mirrors 20, 28. A substrate stage 32 mounted on the track 30 so as to be movable in a direction (also referred to herein as an "x-direction") that is substantially coincident with or substantially parallel to the x-axis $A_x$. The substrate stage 32 is arranged such that a substrate 34 may be securely mounted thereto. In some embodiments of the present invention, the substrate layer 34 has a surficial layer of photoresist PR of a type that may be exposed to light and then developed by chemical solution. In some embodiments of the present invention, the substrate stage 32 is arranged such that the substrate 34 may be securely retained thereupon by vacuum suction.

The interference lithography system 10 is arranged such that a laser beam 36 of a wavelength λ (e.g., λ=325 nm for a HeCd laser) is split into a first beam 38 and a second beam 40 by the beam-splitter 12. Referring first to the first beam 38, the beam 38 is then reflected by the first small mirror 16 such that it passes through the first spatial filter 18 which expands the cross-sectional area of the beam 38. The expanded portion of the beam 38 is referred to hereinafter as the expanded beam 42. At least a portion of the expanded beam 42 is reflected by the first large mirror 20 (e.g., a mirror having a diameter $L_m$=4 inches) which is positioned on the first rotatable stage. The first large mirror 20 in combination with the first rotatable stage may also be referred to hereinafter as the rotatable mirror 44. The reflected portion of the expanded beam 42 is hereinafter referred to as the first reflected beam 46. Referring now to the second beam 40, the beam 40 is then reflected by the second small mirror 24 such that it passes through the second spatial filter 26 which expands the cross-sectional area of the beam 40. The expanded portion of the beam 40 is referred to hereinafter as the expanded beam 48. At least a portion of the expanded beam 48 is reflected by the second large mirror 28 (e.g., a mirror having a diameter $L_m$=4 inches) which is positioned on the second rotatable stage. The second large mirror 28 in combination with the second rotatable stage may also be referred to hereinafter as the second rotatable mirror 50. The reflected portion of the expanded beam 48 is hereinafter referred to as the second reflected beam 52.

Rotation of the first and second rotatable stages about their respective axes of rotation $R_1$ and $R_2$ controls the mirror angles $\beta_1$ and $\beta_2$ (i.e., the angles at which the expanded beams 42, 48 respectively impinge on the first and second rotatable mirrors 44, 50) or, more generally, β, such that the first and second reflected beams 46, 52 cross each other, creating an interference pattern (not shown) at the photoresist layer PR. Selection of the mirror angles $\beta_1$ and $\beta_2$ allows control of the angle (2θ) between two interfering reflected beams 46, 52 and the periodicity of the interference fringe patterns registered on the photoresist layer PR.

The substrate stage 32 can be translated along the x-axis $A_x$ of the track 30 to set the maximum interference coverage area (L) to which the photoresist layer PR is exposed. The interference coverage area L created by the interference of the first and second reflected beams 46, 52 is larger at locations further away from first and second rotatable mirrors 44, 50 in the exemplary interference lithography system 10 of FIG. 1. The use of the two rotatable mirrors 44, 50 and the translational substrate stage 32 allows the interference lithography system 10 to have compact system dimensions, and provides convenient tunability of the pattern periodicity as well as a large interference coverage area (L).

Continuing to refer to the exemplary interference lithography system 10, the rotatable mirrors 44, 50 are each introduced in the path of its respective expanded beam 42, 48 and is independently regulated to a specific incident angle (β, π/4<β<π/2). Thus, the angle of each of the reflected beams 46, 52 (θ=π−2β, 0<θ<π/2) is freely adjustable such that the selected pattern periodicity on the photoresist layer PR can be changed without having to reconfigure the entire optical paths 14, 22. The periodicity (P) of one-dimensional (1-D) fringe patterns defined by a single exposure of the interfering reflected beams 46, 52, with vertical linear polarizations, may be deduced from the following Equation 1:

$$P = \lambda/(2 \sin \theta). \tag{1}$$

The convenient tunability of the angle (2θ) and pattern periodicity (P) by using the rotatable mirrors 44, 50 distinguishes the interference lithography system 10 over conventional two-beam IL systems where the expanded beams after the spatial filters are directly incident onto a substrate with no tunability of the angle (2θ) and pattern periodicity (P). Meanwhile, the location of the substrate stage 32 in the system 10 of the embodiment of FIG. 1 is also adjustable along the x-axis $A_x$ of the track 30 to create a maximum interference coverage area (L) at the desired incident angle 2θ, possibly out to and past the edges of the photoresist layer PR. Therefore, in order to vary the periodicity of the interference pattern, it may be necessary to reposition the angles of the rotatable mirrors 44, 50 and the position of the substrate stage 32 along the x-axis $A_x$ of the track 30, but it is not necessary to reposition any of the other components of the interference lithography system 10.

The theoretical performance of the interference lithography system 10 according to embodiments of the present invention is discussed herein below with reference to FIG. 1 and Equations (1)-(7). From the geometric configuration of the exemplary interference lithography system 10 shown in FIG. 1, assuming a non-divergent beam, the interference coverage area (L) with respect to the mirror size ($L_m$) can be determined from the following Equation (2):

$$L = -L_m \frac{\sin\beta}{\cos 2\beta} = L_m \frac{\cos\theta/2}{\cos\theta}. \tag{2}$$

Combining Equations (1) and (2), the interference coverage area (L) modulated by the mirror size ($L_m$) can then be related to the pattern periodicity (P) by $$L = L_m \sqrt{\frac{2P^2}{4P^2 - \lambda^2} + \frac{P}{\sqrt{4P^2 - \lambda^2}}} \tag{3}$$

However, the extent of interference coverage area (L) does not guarantee that there will be well-defined interference fringes over the entire interference coverage area (L). The effective interference coverage for practical lithography is further restrained by the optical coherence length of the laser that provides the beam 36, which determines the interference visibility (or the fringe quality) on the exposed photoresist layer PR. The fringe contrast (V) (not shown) depends on two independent contrasts relevant to the light intensity (I) (not shown) and the optical path difference ($L_{opd}$) of the interfering reflected beams 46, 52, as suggested by the following Equation 4: such as $$V = V(I) \times V(L_{opd}) = \exp[-(\pi\sigma/c)^2 (L_{opd})^2], \tag{4}$$

where V(I)=1 for cases where the two interfering beams 46, 52 will have the same intensity as each other. In Equation (4), σ is a standard deviation of the Gaussian bandwidth profile of the laser providing the beam 36, and c is the speed of light.

Continuing to refer to FIG. 1, the relationship between the illumination coverage (L) and the optical path difference ($L_{opd}$) can also be obtained as $$L = L_{opd}/\sin\theta. \tag{5}$$

Combining Equations (1) and (5), the coverage (L) modulated by the optical path difference ($L_{opd}$) can also be related to the pattern periodicity (P) by $$L = 2L_{opd} P/\lambda, \tag{6}$$

where the maximum optical path difference $L_{opd}$ (i.e., effective coherent length) allowable for the effective interference visibility should be determined by Equation (4) and results in $$L = \frac{2(c/\pi\sigma)\sqrt{-\ln V_c}}{\lambda} P \quad (7)$$

where $V_c$ is the critical contrast value with which the photoresist material can register clear interference patterns.

The effective interference pattern coverage area (L) is determined by the lower value of L calculated from Equation (3) and Equations (6) or (7). FIG. 2 is a graph showing the characteristics of the pattern periodicity (P) and coverage area (L) for the case of $L_m = L_{opd} = 4$ inches and $\lambda = 325$ nm. It can be seen that at a lower periodicity range the effective pattern coverage is more likely to be limited by the effective coherent length $L_{opd}$ (i.e., the maximally permitted optical path difference for the threshold contrast value for a given photoresist material), while at a higher periodicity range the effective pattern coverage is limited by the dimensions of the mirror ($L_m$). The intersection point of the two curves represents the transition period where the effect of mirror size becomes dominant in limiting the effective coverage area. Despite such constraints, it is evident that the effective coverage (L) obtainable by an interference lithography system according to the exemplary embodiment 10 of the present invention is greater than the selected $L_m$ and $L_{opd}$ values over a wide range of periodicities (P), showing that the system 10 provides large-area nanopatterning with the great tunability of pattern periodicity.

FIGS. 3-5 are graphs illustrating the influences of the critical contrast values ($V_c$) of photoresist materials and the rotatable mirror sizes ($L_m$) on the effective pattern coverage (L) for cases using a HeCd laser of $\lambda = 325$ nm and $\sigma = 425$ Mhz. A comparison of the graphs of FIGS. 3-5 shows that a larger mirror size ($L_m$) leads to a greater pattern coverage area (L), while a photoresist material with a lower critical contrast value ($V_c$) will further improve the pattern coverage (L) near the vicinity of the transition period (i.e., near the intersection points of the curves, as discussed with respect to FIG. 2). Using a laser of a longer coherence length (e.g., a lower $\sigma$ value) will also lead to a greater pattern coverage for the lower period range limited by the optical coherence.

The angular positions of the rotatable mirrors 44, 50 and the distance along which the substrate support 32 should be translated may be calculated from Equations 1-7 or determined empirically. A method for creating a grating on a substrate according to an embodiment of the present invention includes the following steps: preparing a substrate 34 (e.g., a silicon wafer) with a photosensitive coating PR; setting the rotatable mirrors 44, 50 at the necessary angles to create the desired period; translating the substrate support 32 along the desired distance; securing the substrate 34 to the substrate support 32; exposing the photosensitive coating PR to the interfering reflected beams 46, 52 for a desired period of time (which can be selected by one having ordinary skill in the art); and processing (e.g., developing in chemical solution) the substrate 34 so as to leave behind the desired structures on the substrate.

The following example is presented to demonstrate practical applications of interference lithography systems and methods according to embodiments of the present invention. The example does not limit the scope of the invention, which may encompass other embodiments of such systems and methods.

Example

Figure 6:
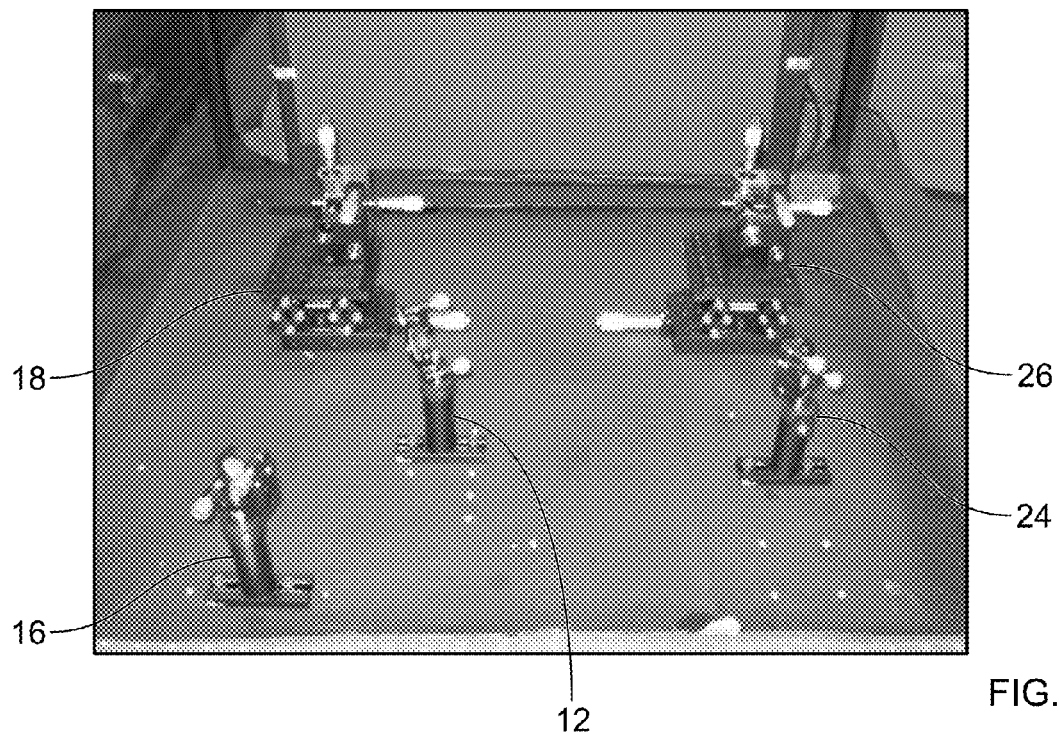
FIG. 6 is a photograph of the arrangement of the fixed components of a simplified interference lithography system according to an embodiment of the present invention.
Figure 7:
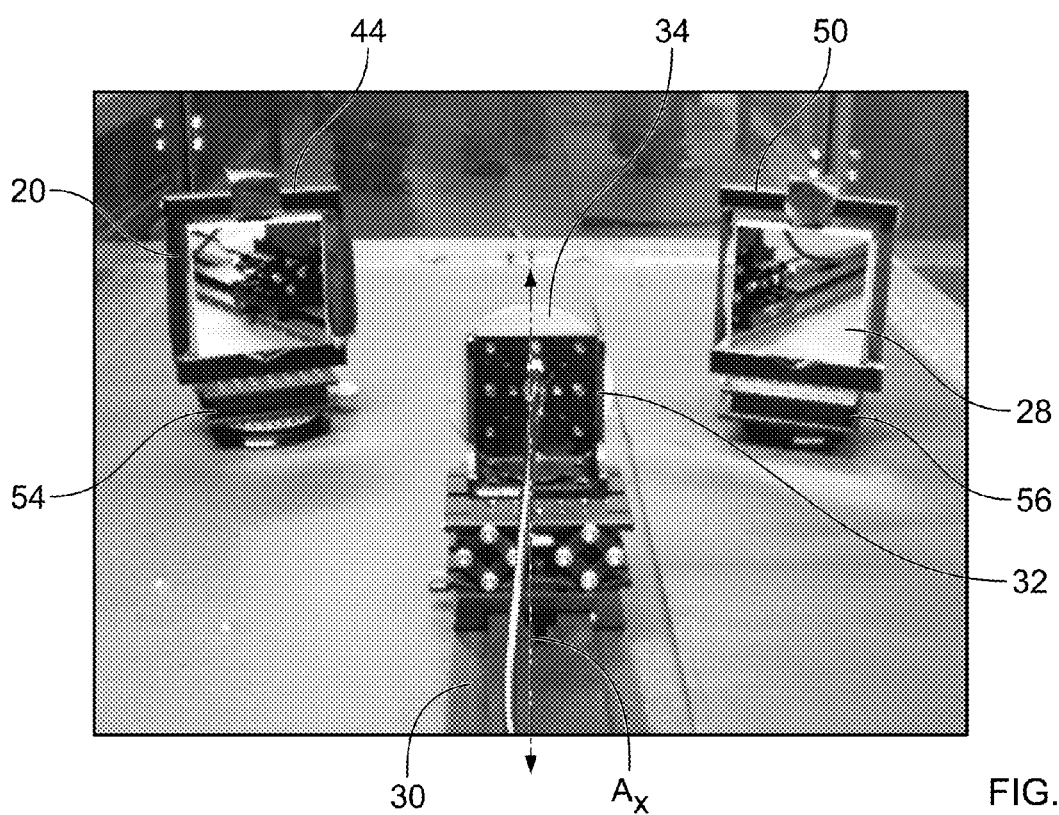
FIG. 7 is a photograph of the arrangement of the adjustable components of the simplified interference lithography system of FIG. 6.

To experimentally demonstrate the performance of the exemplary interference lithography system 10 of FIG. 1, and predicted performance of such as system 10 as discussed with respect to FIGS. 2-5, 1-D interference nano-grating patterns of various periodicities were fabricated on 4-inch silicon substrates using a 50 mW HeCd laser (Kimmon Electric US, LP, Centennial Colo.) of $\lambda = 325$ nm and $\sigma = 425$ Mhz (coherence length of ~30 cm) and two 4-inch rotating mirrors. FIGS. 6 and 7 are photographs of the experimental interference lithography system that was used. This experimental system is a significantly simplified embodiment of the interference lithography system of the present invention, but included a sufficient number of components to demonstrate the performance of other embodiments of the invention. The components of FIGS. 6 and 7 are referenced by the same reference numbers used to indicate the schematic representation of those components in FIG. 1, with additional reference numbers added as needed.

With respect to the system of FIGS. 6 and 7, the laser beam was split into two beams by a dielectric beam splitter 12. Both transmission and reflection beams were incident into two spatial filters 18, 26 with the same optical path length. Each spatial filter 18, 26, each consisting of a focusing lens (not visible) and a 5 μm diameter pinhole (not visible), was used to expand the laser beam (not shown) and clean the beam profile. The expanded beams (not shown) were incident onto respective 4-inch mirrors 20, 28 placed on precision rotation stages 54, 56 after about 1.6 m of beam propagation to provide a good Gaussian intensity distribution of the laser beam over the 4-inch area of the mirrors 20, 28. The mirrors 20, 28 in combination with the respective rotatable stages 54, 56 are referred to hereinafter as rotatable mirrors 44, 50. The 4-inch mirrors 20, 28 (available, e.g., from Edmund Optics, Inc., Barrington, N.J.) were highly reflective UV mirrors, from which the laser beams were redirected to a sample stage 32 set along a track 30. The whole setup was compact and installed on a 4'×8' air-floated optical table to avoid vibration effects, and a cover system was used to protect the setup from air-flow and thermal disturbances. Being a simplified embodiment of the interference lithography system 10 of the present invention, the experimental system did not require a complex electronic feedback subsystem for phase control, such as would typically be used in conventional two-beam interference systems. For the photoresist layer PR, negative photoresist NR7-70P (Futurrex, Inc., Franklin, N.J.) was spin-coated (1000 rpm, 40 seconds) on a 4-inch silicon wafer (i.e., substrate 34) to a film thickness of 100 nm, and then soft-baked at 150° C. for 1 min. After exposure, the sample was post-baked at 100° C. for 1 min and developed by RD6 (Futurrex, 3:1 diluted with water) for 5 seconds.

Figure 8:
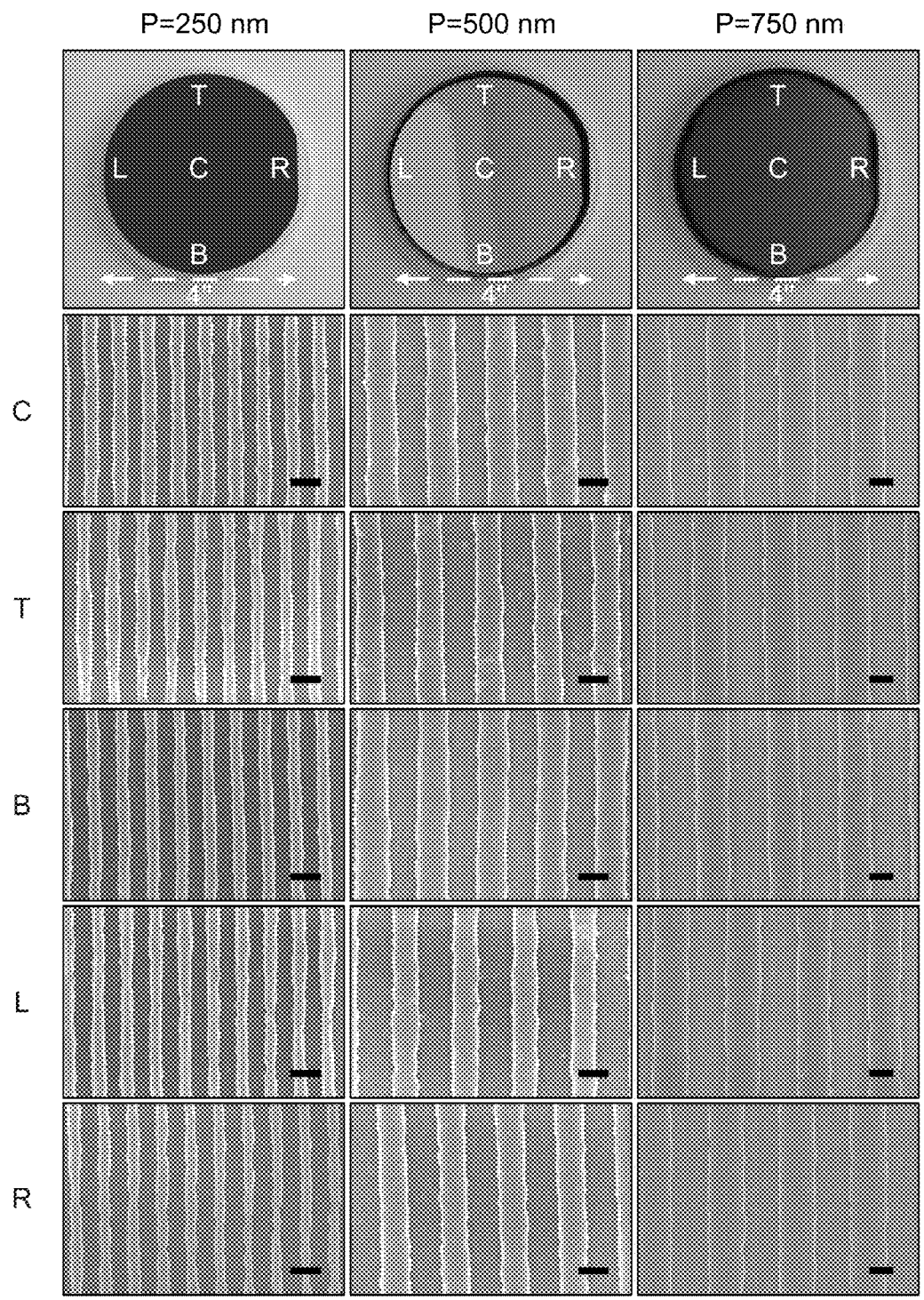
FIG. 8 is a set of photographs and scanning electron microscope (SEM) images of wafers patterned at the nanometer scale using the interference lithography system of FIGS. 6 and 7 by use of a method according to an embodiment of the present invention.

FIG. 8 includes a set of photographs and related scanning electron microscope images showing portions of three gratings fabricated on wafers at periods (P) of 250, 500, and 750 nm, respectively. The regulated incident angle 2θ for the aforesaid periods was 40.5°, 19.0°, and 12.5°, respectively. The top row in the figure shows the optical images of the whole 4-inch wafers with the fabricated nanopatterns for each designed periodicity. Although not clearly visible in FIG. 8, diffraction colors were seen spanning over the entire areas of the wafers, indicating uniform coverage of wafers by the etched nanostructures, The scanning electron microscope (SEM) images below the first row were taken at five different locations over the wafers to further verify that the nanopatterns are well-defined and uniform over the entire wafer area despite the different pattern periodicities. Each column of SEM images is positioned below the photograph of the wafer from which the SEM images in the column were made. The letters along the left side of the rows of SEM images correspond to the letters on the wafers and indicate the area of the wafer at which the respective image was made. The scale bar in each SEM image represents a length of 250 nm.

It can be seen that the nanostructures evident in the SEM images of FIG. 8 are uniform over the entireties of the 4-inch wafers. This confirms the utility of the interference lithography system of the present invention for selecting tunable periods while retaining a large coverage area. Considering that the critical contrast value ($V_c$) of the negative photoresist used in the experiment is about 0.9, the pattern coverage areas (L) obtained are greater than 4 inches for a broad range of periods (e.g., 250 to 1000 nm), revealing that the fabrication results agree with the theoretical prediction shown in FIGS. 2-5.

It should be appreciated that the present invention provides numerous advantages over the prior art discussed above. The system provides the advantages of the Lloyd's system and the conventional two-beam interferometer, providing both tunability in pattern periodicity and the large pattern coverage. Additionally, the present system is compact and can be installed on a smaller optical table compared to conventional systems. The smaller set-up also negates the need for a costly high-power laser. Furthermore, unlike the conventional two-beam interference lithography arrangements, the present system does not require a complex electronic feedback apparatus for phase control. The pattern periodicity attainable by the present system is only limited by the wavelength of a laser source, e.g., the minimum pattern periodicity will be half the wavelength of the laser beam. If the laser source offers a good optical coherence (i.e., a large coherent length), the pattern coverage area is only limited by the mirror size such that the effective pattern coverage area is as large as the mirror size. Further, the period and coverage area of the pattern can be selected by rotation of the rotatable mirrors and translation of the substrate support along a single axis. The efficiency and advantages of the system could be of great benefit to nanolithography in realizing uniform nanostructures over a large substrate area for many scientific and engineering applications, such as photonic devices and solar cells.

It will be understood that the embodiment described herein is merely exemplary and that a person skilled in the art may make many variations and modifications without departing from the spirit and scope of the invention. All such variations and modifications are intended to be included within the scope of the invention as exemplified by the following claim.

What is claimed is:

1. A tunable interference lithographic system, comprising:
first and second rotatable mirrors defining a first axis extending from said first rotatable mirror to said second rotatable mirror;
means for providing first and second expanded beams of laser light of a selected frequency so that the first expanded beam of laser light impinges on said first rotatable mirror and the second expanded beam of laser light impinges on said second rotatable mirror;
a track defining a second axis that is longitudinal in relation to said track and that intersects the first axis at a point between said first and second rotatable mirrors; and
a substrate support for supporting a substrate, said substrate support being translatable along said track in directions along said second axis toward and away from the point between said first and second rotatable mirrors, wherein said first and second rotatable mirrors, said track and said substrate support are arranged such that each of said first and second mirrors are rotatable to positions so as to reflect the first and second expanded beams such that the reflections of the expanded beams interfere with each other to form an interference pattern that illuminates the substrate support, and wherein rotation of one or both of said first and second mirrors and translation of said substrate support along said track are sufficient to control the period and coverage area of the interference pattern at the substrate support.

* * * * *